US012726170B2

(12) United States Patent
Daimon et al.

(10) Patent No.: US 12,726,170 B2
(45) Date of Patent: Sep. 1, 2026

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 149 days.

(21) Appl. No.: 18/381,206

(22) Filed: Oct. 18, 2023

(65) Prior Publication Data

US 2024/0048116 A1 Feb. 8, 2024

Related U.S. Application Data

(63) Continuation of application No. PCT/JP2022/021111, filed on May 23, 2022.

(30) Foreign Application Priority Data

May 27, 2021 (JP) ................................ 2021-089214

(51) Int. Cl.
*H03H 9/02* (2006.01)
*H03H 9/25* (2006.01)

(52) U.S. Cl.
CPC .... *H03H 9/02228* (2013.01); *H03H 9/02818* (2013.01); *H03H 9/02992* (2013.01); *H03H 9/25* (2013.01)

(58) Field of Classification Search
CPC ........... H03H 9/02228; H03H 9/02818; H03H 9/02992; H03H 9/25; H03H 9/02559; H03H 9/02834; H03H 9/02574
USPC .................................................. 333/193–196
See application file for complete search history.

(56) References Cited

U.S. PATENT DOCUMENTS

| | | | | |
|---|---|---|---|---|
| 5,750,243 | A | 5/1998 | Shikata et al. | |
| 11,936,364 | B2 * | 3/2024 | Ballandras | H03H 9/25 |
| 2006/0139414 | A1 | 6/2006 | Iwashita et al. | |
| 2017/0077897 | A1 | 3/2017 | Otsubo et al. | |
| 2018/0159497 | A1 | 6/2018 | Iwamoto et al. | |

(Continued)

FOREIGN PATENT DOCUMENTS

| | | | |
|---|---|---|---|
| JP | 088686 | A | 1/1996 |
| JP | 2006186258 | A | 7/2006 |
| WO | 2015186661 | A1 | 12/2015 |

(Continued)

OTHER PUBLICATIONS

International Search Report in PCT/JP2022/021111, mailed Aug. 2, 2022, 5 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a support substrate, an intermediate layer on the support substrate, a piezoelectric layer on the intermediate layer, a bonding layer between the support substrate and the piezoelectric layer, a low-resistivity layer between the support substrate and the piezoelectric layer, and an IDT electrode on the piezoelectric layer and including a pair of busbars and first and second electrode fingers. The low-resistivity layer closer to the piezoelectric layer than the bonding layer and includes Al as a main component.

19 Claims, 6 Drawing Sheets

(56) References Cited

U.S. PATENT DOCUMENTS

| | | | |
|---|---|---|---|
| 2020/0127636 | A1 | 4/2020 | Kishimoto |
| 2021/0234530 | A1 | 7/2021 | Uno et al. |

FOREIGN PATENT DOCUMENTS

| | | | |
|---|---|---|---|
| WO | 2017043427 | A1 | 3/2017 |
| WO | 2018235731 | A1 | 12/2018 |
| WO | 2020079959 | A1 | 4/2020 |

OTHER PUBLICATIONS

Written Opinion in PCT/JP2022/021111, mailed Aug. 2, 2022, 5 pages.

* cited by examiner

ACOUSTIC WAVE DEVICE

CROSS REFERENCE TO RELATED APPLICATIONS

This application claims the benefit of priority to Japanese Patent Application No. 2021-089214 filed on May 27, 2021 and is a Continuation Application of PCT Application No. PCT/JP2022/021111 filed on May 23, 2022. The entire contents of each application are hereby incorporated herein by reference.

BACKGROUND OF THE INVENTION

1. Field of the Invention

The present invention relates to an acoustic wave device.

2. Description of the Related Art

Heretofore, acoustic wave devices have been widely used in filters of mobile phone devices and so forth. International Publication No. 2017/043427 discloses an example of an acoustic wave device. This acoustic wave device includes a multilayer substrate including a high-acoustic-velocity support substrate, low-acoustic-velocity films, and a piezoelectric film. An interdigital transducer (IDT) electrode is provided on the piezoelectric film. A bonding layer is provided between the low-acoustic-velocity films. The low-acoustic-velocity films are composed of silicon oxide. The bonding layer includes a Ti layer and a Ti oxide layer. The multilayer substrate is formed by bonding the low-acoustic-velocity films to each other via the bonding layer.

SUMMARY OF THE INVENTION

However, when a multilayer substrate includes a bonding layer as in the acoustic wave device described in International Publication No. 2017/043427, the Q value may be degraded due to the effect of conductance. Therefore, insertion loss may increase. In addition, when the bonding layer contacts the low-acoustic-velocity films stray electrons are easily generated. Therefore, the intermodulation distortion (IMD) characteristics may be degraded.

Preferred embodiments of the present invention provide acoustic wave devices that reduce or prevent an increase in insertion loss and improve IMD.

An acoustic wave device according to one broad aspect of a preferred embodiment of the present invention includes a support substrate, an intermediate layer on the support substrate, a piezoelectric layer on the intermediate layer, a bonding layer between the support substrate and the piezoelectric layer, a low-resistivity layer between the support substrate and the piezoelectric layer, and an IDT electrode on the piezoelectric layer and including a pair of busbars and a plurality of electrode fingers. The low-resistivity layer is closer to the piezoelectric layer than the bonding layer. The low-resistivity layer includes Al as a main component.

An acoustic wave device according to another broad aspect of a preferred embodiment of the present invention includes a support substrate, an intermediate layer on the support substrate, a piezoelectric layer on the intermediate layer, a bonding layer between the support substrate and the piezoelectric layer, a low-resistivity layer between the support substrate and the piezoelectric layer, and an IDT electrode on the piezoelectric layer and including a pair of busbars and a plurality of electrode fingers. A resistivity of the low-resistivity layer is lower than a resistivity of the bonding layer. The low-resistivity layer is closer to the piezoelectric layer than the bonding layer. The low-resistivity layer is provided only in a region overlapping at least one of the pair of busbars in plan view.

With the acoustic wave devices according to preferred embodiments of the present invention, an increase in insertion loss is reduced or prevented and IMD is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
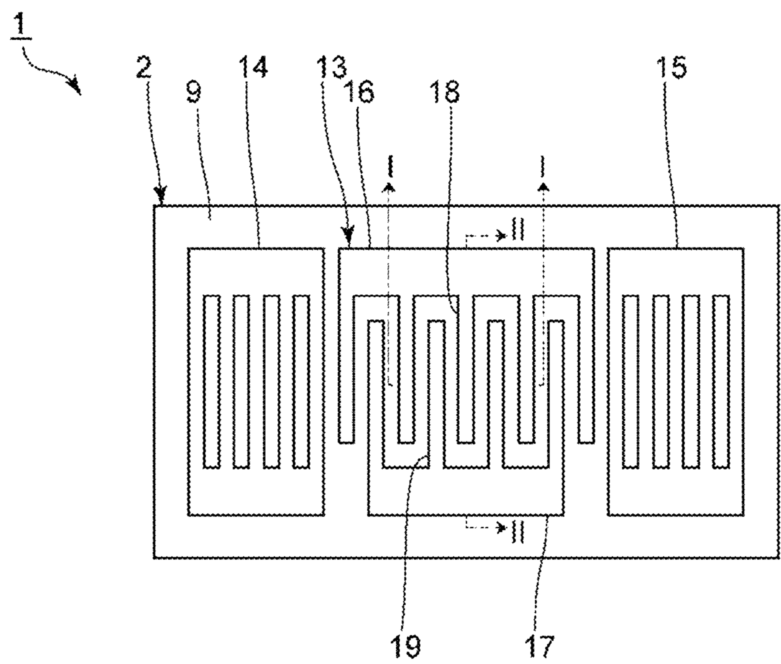
FIG. 1 is a plan view of an acoustic wave device according to a First Preferred Embodiment of the present invention.

Hereafter, the present invention will be made clearer by describing specific preferred embodiments of the present invention while referring to the drawings.

The preferred embodiments described in the present specification are illustrative examples and it should be noted that elements or portions of the configurations illustrated in different preferred embodiments can be substituted for one another or combined with one another.

Figure 2:
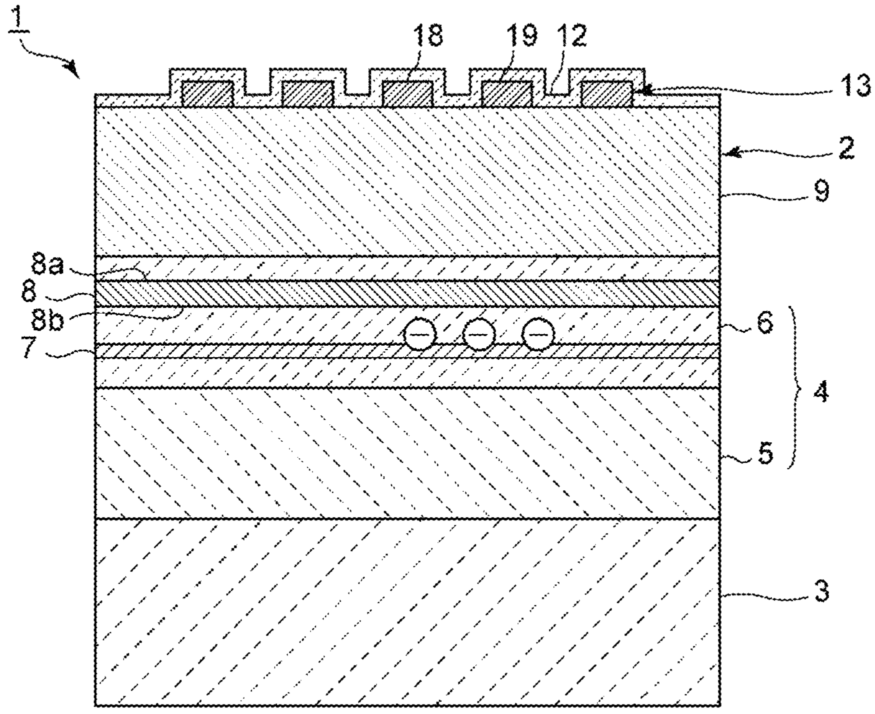
FIG. 2 is a schematic sectional view taken along line I-I in FIG. 1.
Figure 3:
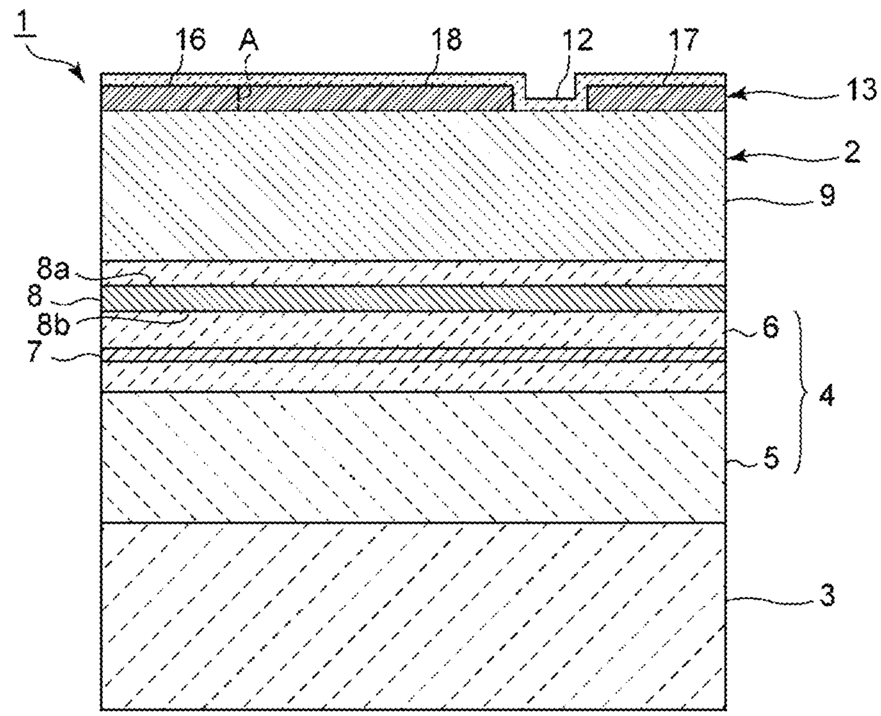
FIG. 3 is a sectional view taken along line II-II in FIG. 1.

FIG. 1 is a plan view of an acoustic wave device according to a First Preferred Embodiment of the present invention. FIG. 2 is a schematic sectional view taken along line I-I in FIG. 1. FIG. 3 is a sectional view taken along line II-II in FIG. 1. A dielectric film, which is described later, is omitted from FIG. 1. Stray electrons are schematically illustrated in FIG. 2. A single-dot chain line A in FIG. 3 represents the boundary between a busbar and electrode fingers, which are described later. This is also the case for single-dot chain lines A in sectional views other than FIG. 3.

As illustrated in FIG. 1, an acoustic wave device 1 includes a piezoelectric substrate 2. As illustrated in FIGS. 2 and 3, the piezoelectric substrate 2 includes a support substrate 3, an intermediate layer 4, a bonding layer 7, a low-resistivity layer 8, and a piezoelectric layer 9. The intermediate layer 4 is provided on the support substrate 3. The piezoelectric layer 9 is provided on the intermediate layer 4. The bonding layer 7 and the low-resistivity layer 8 are provided within the intermediate layer 4. The low-resistivity layer 8 is provided closer to the piezoelectric layer 9 than the bonding layer 7.

The resistivity [Ω·m] of the low-resistivity layer 8 is lower than the resistivity of the bonding layer 7. Since the low-resistivity layer 8 is sheet shaped, the resistance [Ω] of the low-resistivity layer 8 may be expressed as sheet resistance [Ω□] hereafter.

In this preferred embodiment, the low-resistivity layer 8 includes Al as a main component. In this specification, the term "main component" refers to a component accounting for more than 50 wt % of the total. The low-resistivity layer 8 may be an Al layer, for example, or an AlCu layer.

An IDT electrode 13 is provided on the piezoelectric layer 9. Acoustic waves are excited by applying an alternating-current voltage to the IDT electrode 13. A pair of a reflector 14 and a reflector 15 are provided on the piezoelectric layer 9 on both sides in an acoustic wave propagation direction. Thus, the acoustic wave device 1 of this preferred embodiment is a surface acoustic wave resonator. However, the acoustic wave devices according to preferred embodiments of the present invention are not limited to being an acoustic wave resonator, and may be a filter device or a multiplexer including a plurality of acoustic wave resonators.

One of the unique features of this preferred embodiment is that the low-resistivity layer 8 is provided so as to be nearer to the piezoelectric layer 9 than the bonding layer 7 and that the resistivity of the low-resistivity layer 8 is lower than the resistivity of the bonding layer 7. In particular, in the acoustic wave device 1, the low-resistivity layer 8 includes Al as a main component. As a result, an increase in insertion loss can be reduced or prevented and IMD can be improved. This will be described in detail below, along with details of the configuration of this preferred embodiment.

In this preferred embodiment, the piezoelectric layer 9 is a 30° Y-cut X-propagation lithium tantalate layer, for example. However, the cut angle and material of the piezoelectric layer 9 are not limited to this cut angle and this material. For example, lithium niobate can be used as the material of the piezoelectric layer 9.

In this preferred embodiment, the intermediate layer 4 includes a high-acoustic-velocity film 5 and low-acoustic-velocity films 6. More specifically, the intermediate layer 4 is a multilayer body including the high-acoustic-velocity film 5 and the low-acoustic-velocity films 6. The bonding layer 7 and the low-resistivity layer 8 are provided within the low-acoustic-velocity films 6. However, the intermediate layer 4 is not limited to this configuration.

The low-acoustic-velocity films 6 are films having a relatively low acoustic velocity. More specifically, the acoustic velocity of bulk waves propagating through the low-acoustic-velocity films 6 is lower than the acoustic velocity of bulk waves propagating through the piezoelectric layer 9. The low-acoustic-velocity films 6 in this preferred embodiment are silicon oxide films. The material of the low-acoustic-velocity films 6 is not limited to the above material and, for example, a material including, as a main component, glass, silicon oxynitride, lithium oxide, tantalum oxide, or a compound obtained by adding fluorine, carbon, or boron to silicon oxide can be used.

The high-acoustic-velocity film 5 is a film having a relatively high acoustic velocity. The acoustic velocity of a bulk wave propagating though the high-acoustic-velocity film 5 is higher than an acoustic velocity of an acoustic wave propagating through the piezoelectric layer 9. In this preferred embodiment, the high-acoustic-velocity film 5 is a silicon nitride film. For example, the material of the high-acoustic-velocity film 5 is not limited to this material and, for example, a medium including any material out of silicon, aluminum oxide, silicon carbide, silicon oxynitride, sapphire, lithium tantalate, lithium niobate, quartz, alumina, zirconia, cordierite, mullite, steatite, forsterite, magnesia, a diamond-like carbon (DLC) film, and diamond as a main component can be used.

For example, a piezoelectric material such as aluminum oxide, lithium tantalate, lithium niobate, or quartz, any of various ceramic materials such as alumina, sapphire, magnesia, silicon nitride, aluminum nitride, silicon carbide, zirconia, cordierite, mullite, steatite, or forsterite, a dielectric material such as diamond or glass, a semiconductor such as silicon or gallium nitride, or a resin can be used as the material of the support substrate 3.

As described above, in the piezoelectric substrate 2, the high-acoustic-velocity film 5, the low-acoustic-velocity films 6, and the piezoelectric layer 9 are stacked in this order. This enables acoustic wave energy to be effectively confined to the side where the piezoelectric layer 9 is located.

Figure 4:
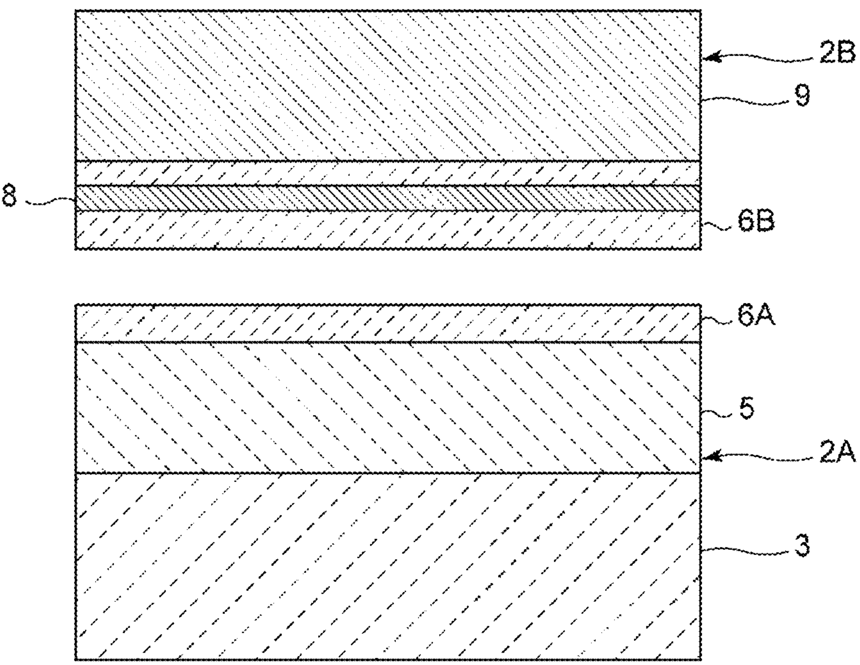
FIG. 4 is a front sectional view for describing an example of a method for forming a piezoelectric substrate in the First Preferred Embodiment of the present invention.

The bonding layer 7 bonds the low-acoustic-velocity films 6 in the intermediate layer 4 to each other. More specifically, when the piezoelectric substrate 2 of this preferred embodiment is to be obtained, a first multilayer body 2A and a second multilayer body 2B illustrated in FIG. 4 are bonded to each other. The first multilayer body 2A is a multilayer body including the support substrate 3, the high-acoustic-velocity film 5, and a low-acoustic-velocity film 6A. The second multilayer body 2B is a multilayer body including a low-acoustic-velocity film 6B and the piezoelectric layer 9. In addition, the low-resistivity layer 8 is provided inside the low-acoustic-velocity film 6B. The low-acoustic-velocity film 6A and the low-acoustic-velocity film 6B are bonded to each other by the bonding layer 7 illustrated in FIG. 2. This reduces the film stress applied to the piezoelectric layer 9 before forming the piezoelectric substrate 2. In this preferred embodiment, the bonding layer 7 includes a Ti layer and a Ti oxide layer. However, the bonding layer 7 is not limited to these materials.

A dielectric film 12 is provided on the piezoelectric layer 9 so as to cover the IDT electrode 13. This makes it less likely that the IDT electrode 13 will be damaged. In this preferred embodiment, the dielectric film 12 is a silicon oxide film. This enables the absolute value of the temperature coefficient of frequency (TCF) of the acoustic wave device 1 to be effectively reduced, and the frequency-temperature characteristics to be improved. However, the dielectric film 12 is not limited to this material. For example, when the dielectric film 12 is a silicon nitride film, the dielectric film 12 can be used as a frequency-adjusting film. In addition, the dielectric film 12 does not necessarily have to be provided.

As illustrated in FIG. 1, the IDT electrode 13 includes a first busbar 16, a second busbar 17, a plurality of first electrode fingers 18, and a plurality of second electrode fingers 19. The first busbar 16 and the second busbar 17 face each other. One end of each of the plurality of first electrode fingers 18 is connected to the first busbar 16. One end of each of the plurality of second electrode fingers 19 is connected to the second busbar 17. The plurality of first electrode fingers 18 and the plurality of second electrode fingers 19 are interdigitated with each other. The direction in which the first electrode fingers 18 and the second electrode fingers 19 extend is referred to as an electrode finger extension direction. In this preferred embodiment, the electrode finger extension direction is perpendicular to the acoustic wave propagation direction. The IDT electrode 13, the reflector 14, and the reflector 15 may include a multi-layer metal film or may include a single-layer metal film.

As described above, in this preferred embodiment, an increase in insertion loss can be reduced or prevented and IMD can be improved. This will be explained below.

Figure 5:
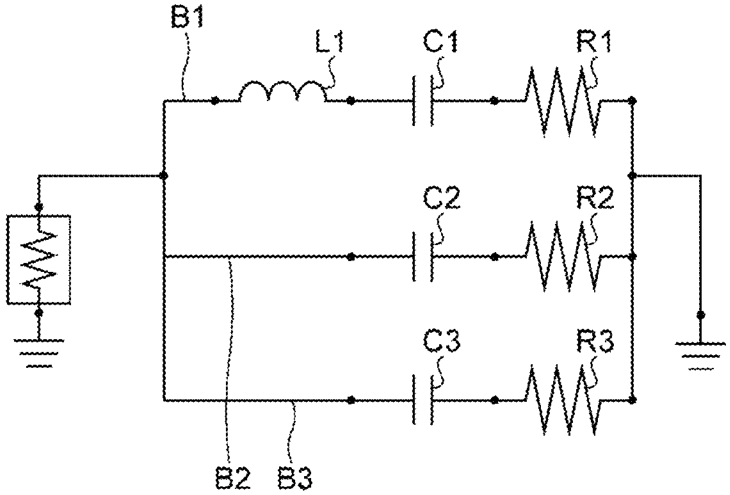
FIG. 5 illustrates an equivalent circuit of the acoustic wave device according to the First Preferred Embodiment of the present invention.

FIG. 5 illustrates an equivalent circuit of the acoustic wave device according to the First Preferred Embodiment.

The equivalent circuit of the acoustic wave device 1 includes a first series circuit section B1, a second series circuit section B2, and a third series circuit section B3. The first series circuit section B1, the second series circuit section B2, and the third series circuit section B3 are connected in parallel with each other. In the first series circuit section B1, a resistance R1, a capacitance C1, and an inductance L1 are connected in series with each other. In the second series circuit section B2, a resistance R2 and a capacitance C2 are connected in series with each other. In the third series circuit section B3, a resistance R3 and a capacitance C3 are connected in series with each other. In general, the equivalent circuit of an acoustic wave resonator includes a circuit in which the first series circuit section B1 and the second series circuit section B2 are connected in parallel with each other. In contrast, in this preferred embodiment, the equivalent circuit includes the third series circuit section B3. This is due to the acoustic wave device 1 including the low-resistivity layer 8.

The resistance R3 in the third series circuit section B3 is the resistance of the low-resistivity layer 8. Unless the resistance of the low-resistivity layer 8 is sufficiently low, the effect of the conductance in the third series circuit section B3 cannot be ignored. Therefore, there is a risk of the Q value being degraded due to the effect of conductance. In contrast, if the resistivity of the low-resistivity layer 8 is lower than the resistivity of the bonding layer 7, as in this preferred embodiment, and the resistance of the low-resistivity layer 8 is sufficiently low, the resistance R3 in the equivalent circuit will be almost negligible. Therefore, the effect of conductance in the third series circuit section B3 in the acoustic wave device 1 is reduced, and the Q value is unlikely to be degraded. Therefore, when the acoustic wave device 1 is used in a filter device, the insertion loss is unlikely to be degraded.

In particular, when the low-resistivity layer 8 includes Al as a main component, as in this preferred embodiment, the resistivity of the low-resistivity layer 8 can be more reliably lowered. Therefore, the effect of conductance in the third series circuit section B3 can be more reliably reduced, and the Q value can be more reliably made unlikely to be degraded. Therefore, when the acoustic wave device 1 is used in a filter device, degradation of the insertion loss can be more reliably reduced or prevented.

Furthermore, the capacitance C3 in the third series circuit section B3 can be used. Therefore, there is no need to increase the size of the IDT electrode 13 or to provide a separate capacitance in order to increase the element capacitance. Therefore, the acoustic wave device 1 can be made small in size.

Here, as illustrated in FIG. 2, when the bonding layer 7 contacts the intermediate layer 4, stray electrons may be generated at the interface between the bonding layer 7 and the intermediate layer 4. If the stray electrons reach the IDT electrode 13, IMD will be degraded. In contrast, in this preferred embodiment, the low-resistivity layer 8 is provided so as to be closer to the piezoelectric layer 9 than the bonding layer 7. Consequently, even if stray electrons are generated, the stray electrons can be trapped by the low-resistivity layer 8. Therefore, a situation in which stray electrons reach the IDT electrode 13 can be reduced or prevented, and degradation of IMD can be reduced or prevented.

The bonding layer 7 preferably includes a Ti layer and a Ti oxide layer. In this case, stray electrons are easily generated at the interface between the bonding layer 7 and the intermediate layer 4. Alternatively, the intermediate layer 4 preferably includes the low-acoustic-velocity films 6, the low-acoustic-velocity films 6 are silicon oxide films, and the low-acoustic-velocity films 6 and the bonding layer 7 are in contact with each other. In this case as well, stray electrons are easily generated at the interface between the bonding layer 7 and the intermediate layer 4. Thus, preferred embodiments of the present invention is particularly suitable in the above cases.

The sheet resistance of the low-resistivity layer 8 is preferably less than or equal to about 1Ω□, for example. This further reduces the effect of conductance and makes degradation of the Q value even less likely. This will be described in detail below. In the acoustic wave device 1, the sheet resistance of the low-resistivity layer 8 was varied and the Q value was measured. Examples of the design parameters of the acoustic wave device 1 are as follows.

- Support substrate 3; material . . . Si, surface contacting intermediate layer 4 . . . (111) surface
- High-acoustic-velocity film 5; material . . . SiN, thickness . . . 300 nm
- Low-acoustic-velocity films 6; material . . . $SiO_2$, thickness . . . 300 nm
- Bonding layer 7; material . . . Ti and Ti oxide, thickness . . . 0.4 nm
- Sheet resistance of low-resistivity layer 8; varied in increments of the power of ten in a range from $10^{-1}$Ω□ to $10^{5}$Ω□.
- Piezoelectric layer 9; material . . . 30° Y-cut X-propagation $LiTaO_3$, thickness . . . 400 nm
- IDT electrode 13; layer configuration . . . Ti layer/Al layer/Ti layer from side near piezoelectric layer 9, thickness . . . 12 nm/100 nm/4 nm from side near piezoelectric layer 9
- Dielectric film 12; material . . . $SiO_2$, thickness . . . 30 nm FIG. 6 is a diagram illustrating the relationship between the sheet resistance of the low-resistivity layer and the Q value.

Figure 6:
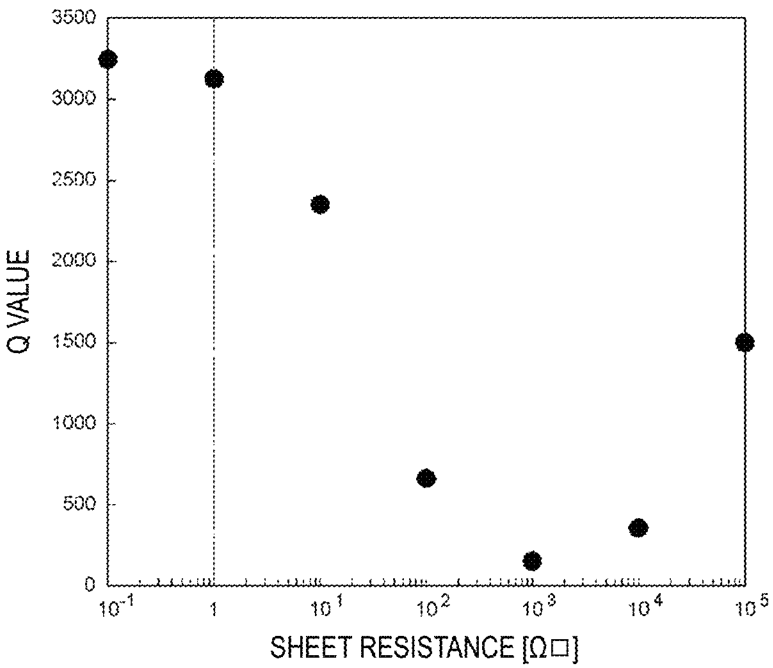
FIG. 6 is a diagram illustrating the relationship between the sheet resistance of a low-resistivity layer and the Q value.

As illustrated in FIG. 6, the Q value is low when the sheet resistance of the low-resistivity layer 8 exceeds about 1Ω□, for example. On the other hand, when the sheet resistance of the low-resistivity layer 8 is less than or equal to about 1Ω□, for example, the Q value can be high. Therefore, when acoustic wave device 1 is used in a filter device, the insertion loss is even less likely to be degraded.

In this preferred embodiment, the low-resistivity layer 8 is an Al layer, for example. However, the material of the low-resistivity layer 8 is not limited to Al. Here, the thickness at which the sheet resistance becomes about 1Ω□ was determined for Al and various metals other than Al. The thickness at which the sheet resistance becomes about 1Ω□ is denoted by Y [nm].

Figure 7:
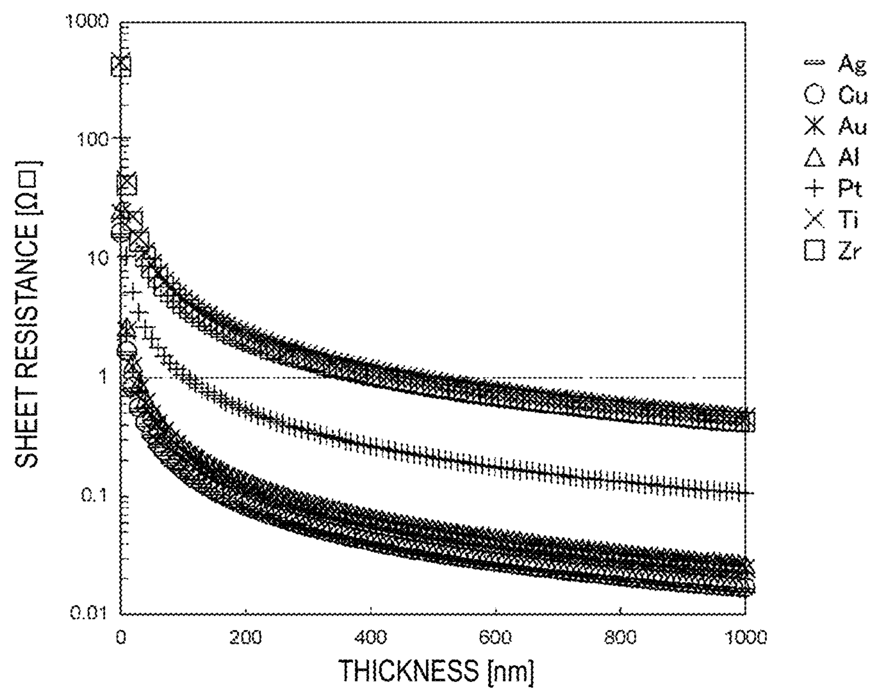
FIG. 7 is a diagram illustrating the relationship between the thickness of a metal material and sheet resistance.
Figure 8:
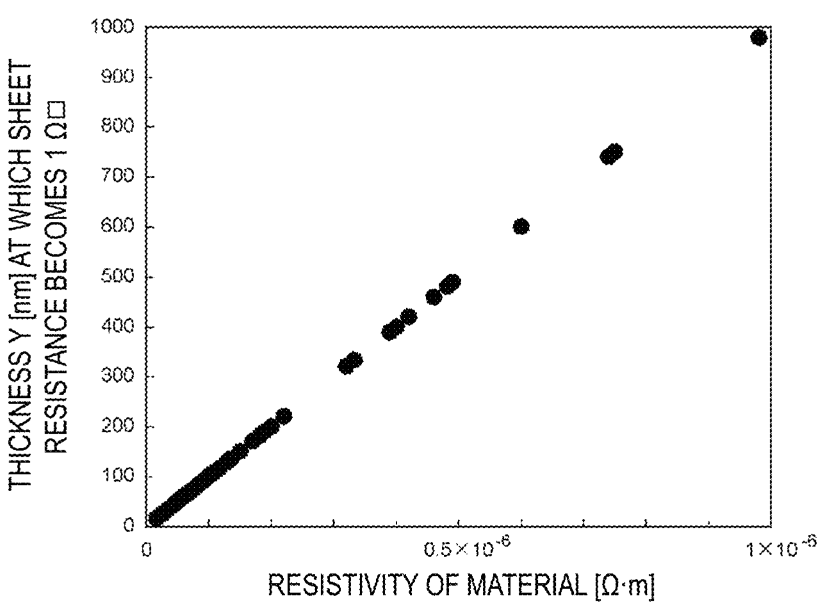
FIG. 8 is a diagram illustrating the relationship between the resistivity of a material and a thickness Y at which the sheet resistance becomes 1Ω□.

FIG. 7 is a diagram illustrating the relationship between the thickness of a metal material and sheet resistance. FIG. 8 is a diagram illustrating the relationship between the resistivity of a material and the thickness Y at which the sheet resistance becomes about 1Ω□.

As illustrated in FIG. 7, the sheet resistance becomes lower as the thickness of the metal material increases regardless of whether the metal material is Ag, Cu, Au, Al, Pt, Ti, or Zr. For each metal material, the thickness Y at which the sheet resistance becomes about 1Ω□ is different. This is due to the different resistivity of each material. When the thickness of the low-resistivity layer 8 is denoted by tL [nm], the material of the low-resistivity layer 8 and the range of the thickness tL are preferably one of the combinations listed in Table 1. This allows the sheet resistance of the low-resistivity layer 8 to be more reliably made less than or equal to about 1Ω□. In this case, the Q value is even less likely to be degraded, as illustrated in FIG. 6. Therefore, when the acoustic wave device 1 is used in a filter device, the insertion loss is unlikely to be degraded. Furthermore, because the thickness Y is small, the thickness tL at which the sheet resistance of the low-resistivity layer 8 can be made low is sufficiently small. Therefore, damping is unlikely to occur. Therefore, the energy efficiency of the acoustic wave device 1 is unlikely to be degraded.

TABLE 1

| Material | Thickness tL [nm] |
|---|---|
| Ag | $tL \geq 15.9$ |
| Au | $tL \geq 24.4$ |
| Al | $tL \geq 26.5$ |
| Cu | $tL \geq 16.8$ |

For various materials other than the seven metal materials illustrated in FIG. 7, the thickness Y at which the sheet resistance becomes about 1Ω□ was also determined. As illustrated in FIG. 8, there is a proportional relationship between the resistivity and the thickness Y of the material. Here, when the resistivity of the low-resistivity layer 8 is denoted by ρ[Ω·m], the relationship between the resistivity ρ and the thickness Y is expressed by the following Formula 1 based on the results in FIG. 8.

$$Y=10^9\times\rho+1.21\times10^{-13} \quad \text{Formula 1}$$

The relationship between the thickness tL of the low-resistivity layer 8 and the thickness Y is preferably $tL\geq Y$. In this case, the sheet resistance of the low-resistivity layer 8 can be made less than or equal to about 1Ω□. Therefore, the Q value is even less likely to be degraded. On the other hand, the upper limit of the thickness tL of the low-resistivity layer 8 is not particularly limited, but for example, $tL\leq 1000$ nm is preferred. In this case, the low-resistivity layer 8 is easy to form.

The thickness of the low-resistivity layer 8 is preferably larger than the thickness of the bonding layer 7. In this case, the sheet resistance of the low-resistivity layer 8 can be more reliably lowered, and the effect of conductance can be more reliably reduced.

As described above, the low-resistivity layer 8 is in contact with the low-acoustic-velocity films 6 in the intermediate layer 4. In this preferred embodiment, the low-resistivity layer 8 includes Al as a main component. The low-acoustic-velocity films 6 are silicon oxide films. Therefore, the difference between the acoustic impedance of the low-resistivity layer 8 and the acoustic impedance of the low-acoustic-velocity films 6 in the intermediate layer 4 is small. Therefore, unwanted waves are unlikely to be reflected toward the piezoelectric layer 9 at the interface between the low-resistivity layer 8 and the intermediate layer 4. Therefore, the electrical characteristics of the acoustic wave device 1 are even less likely to be degraded. The acoustic impedance of the low-resistivity layer 8 is preferably less than or equal to twice the acoustic impedance of the layer in contact with the low-resistivity layer 8 in the intermediate layer 4. In this case as well, unwanted waves are unlikely to be reflected toward the piezoelectric layer 9.

Figure 9:
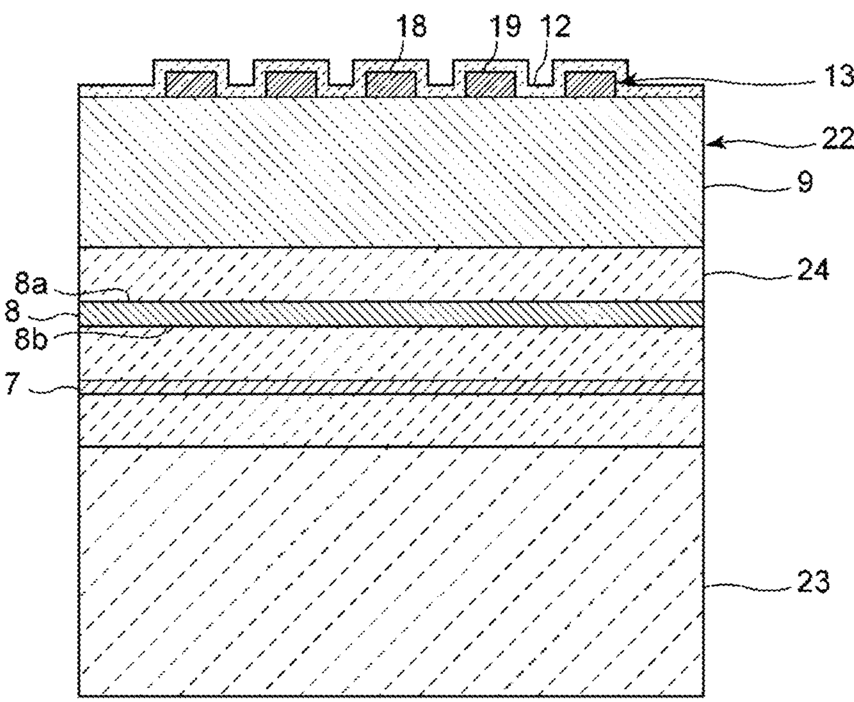
FIG. 9 is a front sectional view of an acoustic wave device according to a First Modification of the First Preferred Embodiment of the present invention.

The intermediate layer 4 may be a film including one material. In a First Modification of the First Preferred Embodiment illustrated in FIG. 9, an intermediate layer 24 is a low-acoustic-velocity film. The support substrate is a high-acoustic-velocity support substrate 23. The intermediate layer 24 is provided on the high-acoustic-velocity support substrate 23. The piezoelectric layer 9 is provided on the intermediate layer 24. In a piezoelectric substrate 22, the high-acoustic-velocity support substrate 23, the intermediate layer 24 serving as a low-acoustic-velocity film, and the piezoelectric layer 9 are stacked in this order. This enables acoustic wave energy to be effectively confined to the side where the piezoelectric layer 9 is located. In this modification, the intermediate layer 24 is preferably a silicon oxide film. In this case, preferred embodiments of the present invention are suitable since stray electrons are easily generated at the interface between the bonding layer 7 and the intermediate layer 24.

The acoustic velocity of a bulk wave propagating though the high-acoustic-velocity support substrate 23 is higher than the acoustic velocity of an acoustic wave propagating through the piezoelectric layer 9. For example, a medium including any material out of silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a DLC film, and diamond as a main component can be used as the material of the high-acoustic-velocity support substrate 23.

Figure 10:
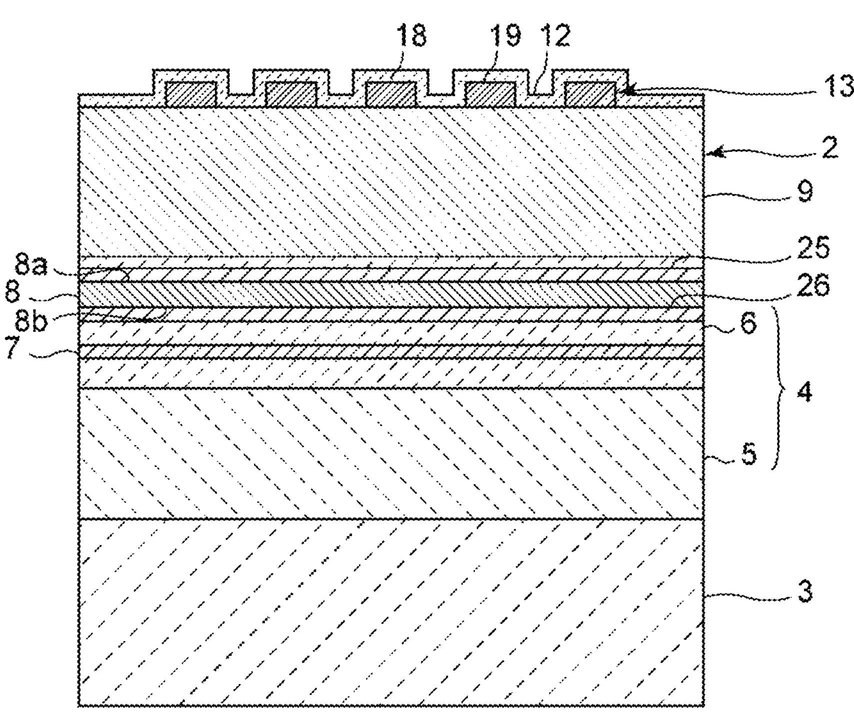
FIG. 10 is a front sectional view of an acoustic wave device according to a Second Modification of the First Preferred Embodiment of the present invention.

In this preferred embodiment, the low-resistivity layer 8 is in direct contact with the intermediate layer 4. However, an adhesive layer may be stacked on the low-resistivity layer 8. In a Second Modification of the First Preferred Embodiment illustrated in FIG. 10, an adhesive layer 25 and an adhesive layer 26 are stacked on the low-resistivity layer 8. More specifically, the low-resistivity layer 8 includes a first main surface **8*a* and a second main surface 8*b*. The first main surface 8*a* and the second main surface 8*b* face each other. The adhesive layer 25 is provided on the first main surface 8*a*. The adhesive layer 26 is provided on the second main surface 8*b*. This allows the adhesion between the low-resistivity layer 8 and the intermediate layer 4 to be increased. Therefore, delamination between layers of the piezoelectric substrate 2 is less likely to occur. For example, Ti or the like can be used as the material of the adhesive layer 25 and the adhesive layer 26**.

Furthermore, the thickness of both the adhesive layer 25 and the adhesive layer 26 is smaller than the thickness of the low-resistivity layer 8. This allows the sheet resistance of the multilayer body including the adhesive layer 26, the low-resistivity layer 8, and the adhesive layer 25 to be made suitably low without increasing the thickness of the multilayer body. In this modification, similarly to as in the First Preferred Embodiment, an increase in insertion loss can be reduced or prevented and IMD can be improved.

As illustrated in FIGS. 2 and 3, in the acoustic wave device 1, the low-resistivity layer 8 overlaps the entirety of the IDT electrode 13 in plan view. Note that it is sufficient that the low-resistivity layer 8 overlap at least one out of the first busbar 16 and second busbar 17 of the IDT electrode 13.

Figure 11:
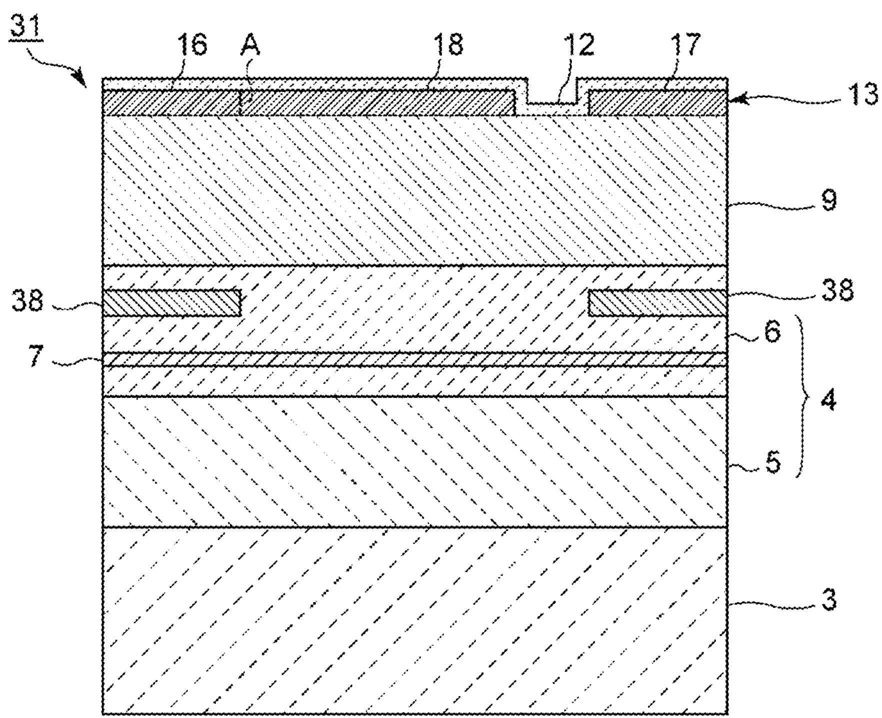
FIG. 11 is a sectional view of an acoustic wave device according to a Second Preferred Embodiment of the present invention taken along an electrode finger extension direction.

FIG. 11 is a sectional view of an acoustic wave device according to a Second Preferred Embodiment taken along an electrode finger extension direction.

This preferred embodiment differs from the First Preferred Embodiment with respect to the arrangement of a low-resistivity layer 38 in plan view. In other respects, an acoustic wave device 31 of this preferred embodiment has substantially the same configuration as the acoustic wave device 1 of the First Preferred Embodiment.

This preferred embodiment is characterized by including the following configurations. 1) Similarly to the First Preferred Embodiment, the resistivity of the low-resistivity layer 38 is lower than the resistivity of the bonding layer 7, and the low-resistivity layers 38 are provided closer to the piezoelectric layer 9 than the bonding layer 7. 2) Furthermore, the low-resistivity layer 38 is provided only in a region overlapping at least one out of the first busbar 16 and the second busbar 17 in plan view. More specifically, in this preferred embodiment, one out of a pair of low-resistivity layers 38 is provided in a region overlapping only the first busbar 16 in plan view. The other one out of the pair of low-resistivity layers 38 is provided in a region overlapping only the second busbar 17 in plan view.

In this case as well, similarly to the First Preferred Embodiment, the effect of conductance can be reduced and the Q value is unlikely to be degraded. Therefore, when the acoustic wave device 31 is used in a filter device, an increase in insertion loss can be reduced or prevented. Furthermore, since a situation in which stray electrons reach the first busbar 16 or second busbar 17 can be reduced or prevented, IMD can be improved.

In addition, in plan view, the low-resistivity layer 38 does not overlap the IDT electrode 13, except for the first busbar 16 or second busbar 17, in plan view. Thus, unwanted waves are less likely to be reflected by the low-resistivity layer 38. Therefore, the electrical characteristics of the acoustic wave device 31 are even less likely to be degraded.

Figure 12:
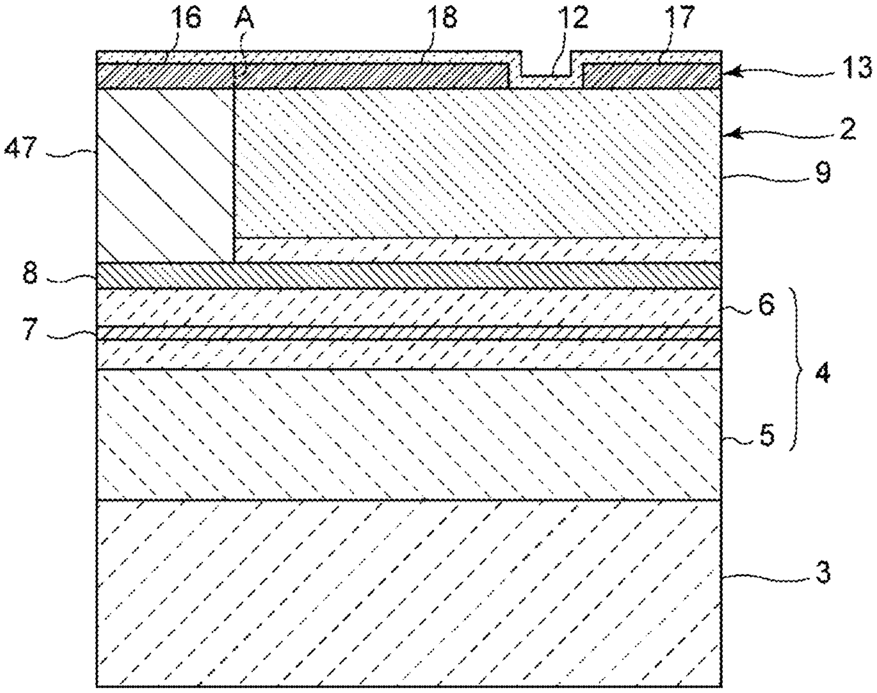
FIG. 12 is a sectional view of an acoustic wave device according to a Third Preferred Embodiment of the present invention taken along an electrode finger extension direction.

FIG. 12 is a sectional view of an acoustic wave device according to a Third Preferred Embodiment taken along an electrode finger extension direction.

This preferred embodiment differs from the First Preferred Embodiment in that the first busbar 16 and the low-resistivity layer 8 are electrically connected to each other. In other respects, the acoustic wave device of this preferred embodiment has substantially the same configuration as the acoustic wave device 1 of the First Preferred Embodiment.

More specifically, the first busbar 16 and the low-resistivity layer 8 are connected to each other by a through electrode 47. The through electrode 47 penetrates though the piezoelectric layer 9 and reaches the inside of the intermediate layer 4. The first busbar 16 is connected to the ground potential. Therefore, the low-resistivity layer 8 is connected to the ground potential via the through electrode 47 and the first busbar 16. This allows the low-resistivity layer 8 to function as a shield electrode. Therefore, stray electrons generated at the interface between the bonding layer 7 and the intermediate layer 4 can be made to migrate toward the ground potential. Therefore, stray electrons can be further impeded from reaching the IDT electrode 13, and IMD is even less likely to be degraded. In addition, similarly to the First Preferred Embodiment, the effect of conductance can be reduced and the Q value is unlikely to be degraded. Therefore, when the acoustic wave device is used in a filter device, an increase in insertion loss can be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support substrate;

an intermediate layer on the support substrate;

a piezoelectric layer on the intermediate layer;

a bonding layer between the support substrate and the piezoelectric layer;

a low-resistivity layer between the support substrate and the piezoelectric layer; and an IDT electrode on the piezoelectric layer and including a pair of busbars and a plurality of electrode fingers; wherein the low-resistivity layer is closer to the piezoelectric layer than the bonding layer and the low-resistivity layer includes Al as a main component;

the intermediate layer is a multilayer body; and the bonding layer is between two layers of the multilayer body.

2. The acoustic wave device according to claim 1, wherein the bonding layer and the low-resistivity layer are provided within the intermediate layer.

3. The acoustic wave device according to claim 2, wherein the multilayer body includes a high-acoustic-velocity film and a low-acoustic-velocity film, the bonding layer and the low-resistivity layer being provided within the low-acoustic-velocity film;

an acoustic velocity of a bulk wave propagating though the high-acoustic-velocity film is higher than an acoustic velocity of an acoustic wave propagating through the piezoelectric layer; and an acoustic velocity of a bulk wave propagating through the low-acoustic-velocity film is lower than an acoustic velocity of a bulk wave propagating through the piezoelectric layer.

4. The acoustic wave device according to claim 1, wherein a sheet resistance of the low-resistivity layer is less than or equal to about 1 Ω□.

5. The acoustic wave device according to claim 1, wherein when a resistivity of the low-resistivity layer is denoted by $\rho[\Omega \cdot m]$ and a thickness of the low-resistivity layer is denoted by tL [nm], a relationship between the thickness tL and Y [nm] in Formula 1 is tL≥ Y:

$$Y=10^9\times\rho+1.21\times10^{-13} \quad \text{Formula 1.}$$

6. The acoustic wave device according to claim 1, wherein a thickness of the low-resistivity layer is larger than a thickness of the bonding layer.

7. The acoustic wave device according to claim 1, wherein adhesive layers are provided on one main surface and another main surface of the low-resistivity layer, and a thickness of both adhesive layers is smaller than a thickness of the low-resistivity layer.

8. The acoustic wave device according to claim 1, wherein the intermediate layer includes a silicon oxide film and the silicon oxide film and the bonding layer contact each other.

9. The acoustic wave device according to claim 1, wherein one of the pair of busbars of the IDT electrode is connected to a ground potential; and the low-resistivity layer is electrically connected to the busbar connected to the ground potential.

10. An acoustic wave device comprising:

a support substrate;

an intermediate layer on the support substrate;

a piezoelectric layer on the intermediate layer;

a bonding layer between the support substrate and the piezoelectric layer;

a low-resistivity layer between the support substrate and the piezoelectric layer; and an IDT electrode on the piezoelectric layer and including a pair of busbars and a plurality of electrode fingers; wherein a resistivity of the low-resistivity layer is lower than a resistivity of the bonding layer; and the low-resistivity layer is closer to the piezoelectric layer than the bonding layer, and the low-resistivity layer is provided only in a region overlapping at least one of the pair of busbars in plan view.

11. The acoustic wave device according to claim 10, wherein when a thickness of the low-resistivity layer is denoted by tL [nm], a material of the low-resistivity layer and a range of the thickness tL are any of the combinations listed in Table 1:

TABLE 1

| Material | Thickness tL [nm] |
|---|---|
| Ag | tL ≥ 15.9 |
| Au | tL ≥ 24.4 |
| Al | tL ≥ 26.5 |
| Cu | tL ≥ 16.8. |

12. The acoustic wave device according to claim 10, wherein the bonding layer and the low-resistivity layer are provided within the intermediate layer.

13. The acoustic wave device according to claim 12, wherein the intermediate layer is a multilayer body including a high-acoustic-velocity film and a low-acoustic-velocity film, the bonding layer and the low-resistivity layer being provided within the low-acoustic-velocity film;

an acoustic velocity of a bulk wave propagating though the high-acoustic-velocity film is higher than an acoustic velocity of an acoustic wave propagating through the piezoelectric layer; and an acoustic velocity of a bulk wave propagating through the low-acoustic-velocity film is lower than an acoustic velocity of a bulk wave propagating through the piezoelectric layer.

14. The acoustic wave device according to claim 10, wherein a sheet resistance of the low-resistivity layer is less than or equal to about 1 Ω□.

15. The acoustic wave device according to claim 10, wherein when a resistivity of the low-resistivity layer is denoted by ρ[Ω·m] and a thickness of the low-resistivity layer is denoted by tL [nm], a relationship between the thickness tL and Y [nm] in Formula 1 is tL≥Y:

$$Y=10^9\times\rho+1.21\times10^{-13} \quad \text{Formula 1.}$$

16. The acoustic wave device according to claim 10, wherein a thickness of the low-resistivity layer is larger than a thickness of the bonding layer.

17. The acoustic wave device according to claim 10, wherein adhesive layers are provided on one main surface and another main surface of the low-resistivity layer, and a thickness of both adhesive layers is smaller than a thickness of the low-resistivity layer.

18. The acoustic wave device according to claim 10, wherein the intermediate layer includes a silicon oxide film and the silicon oxide film and the bonding layer contact each other.

19. The acoustic wave device according to claim 10, wherein one of the pair of busbars of the IDT electrode is connected to a ground potential; and the low-resistivity layer is electrically connected to the busbar connected to the ground potential.

* * * * *